US011895784B2

(12) United States Patent
Lee et al.

(10) Patent No.: US 11,895,784 B2
(45) Date of Patent: Feb. 6, 2024

(54) ELECTRONIC CONTROL APPARATUS

(71) Applicant: LS ELECTRIC CO., LTD., Anyang-si (KR)

(72) Inventors: Su Hyeong Lee, Anyang-si (KR); Soo Yong Hwang, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 0 days.

(21) Appl. No.: 17/799,516

(22) PCT Filed: Jan. 12, 2021

(86) PCT No.: PCT/KR2021/000387
§ 371 (c)(1),
(2) Date: Aug. 12, 2022

(87) PCT Pub. No.: WO2021/162247
PCT Pub. Date: Aug. 19, 2021

(65) Prior Publication Data
US 2023/0354531 A1 Nov. 2, 2023

(30) Foreign Application Priority Data
Feb. 13, 2020 (KR) .......................... 10-2020-0017536

(51) Int. Cl.
*H01H 13/04* (2006.01)
*H05K 5/00* (2006.01)
*H01H 13/02* (2006.01)

(52) U.S. Cl.
CPC ........... *H05K 5/0052* (2013.01); *H01H 13/04* (2013.01); *H05K 5/0018* (2022.08);
(Continued)

(58) Field of Classification Search
CPC ....... H05K 5/0052; H05K 2201/10106; H05K 2201/10121
See application file for complete search history.

(56) References Cited

U.S. PATENT DOCUMENTS 5,768,370 A * 6/1998 Maatta ................ H04M 1/0283
379/434
6,904,300 B1 * 6/2005 Maattanen .......... H04M 1/0266
455/90.3

(Continued)

FOREIGN PATENT DOCUMENTS

JP 2000067692 A 3/2000
JP 2002536916 A 10/2002
(Continued)

OTHER PUBLICATIONS

International Search Report for related International Application No. PCT/KR2021/000387; report dated Aug. 19, 2021; (5 pages).
(Continued)

*Primary Examiner* — Evan P Dzierzynski
(74) *Attorney, Agent, or Firm* — K&L Gates LLP

(57) ABSTRACT

An electronic control device according to an embodiment of the present disclosure comprises a lower cover including a side wall with a first coupling portion and a second coupling portion; a circuit board arranged inside the side wall of the lower cover and having on the upper surface thereof a button; a middle cover provided with a third coupling portion coupled to the first coupling portion and a first button hole, and coupled to the lower cover by coupling of the third coupling portion to the first coupling portion; a button cover arranged on the upper surface of the middle cover, covering the first button hole, and having a protrusion portion; and an upper cover including a side wall provided with a fourth coupling portion coupled to the second coupling portion, the upper cover provided with a second button hole, and covering the button cover and the middle cover.

11 Claims, 7 Drawing Sheets

(52) U.S. Cl.
   CPC . *H01H 13/023* (2013.01); *H05K 2201/10106* (2013.01); *H05K 2201/10121* (2013.01)

(56) References Cited

U.S. PATENT DOCUMENTS

| | | | |
|---|---|---|---|
| 7,013,167 B2* | 3/2006 | Pan | H04M 1/0262 |
| | | | 455/575.8 |
| 7,203,467 B2* | 4/2007 | Siddiqui | H04M 1/185 |
| | | | 455/575.8 |
| 7,330,743 B2* | 2/2008 | Hutchison | H04M 1/0283 |
| | | | 455/575.8 |
| 2004/0204025 A1* | 10/2004 | Siddiqui | H04M 1/0266 |
| | | | 455/90.3 |
| 2012/0044668 A1* | 2/2012 | Takeuchi | G02F 1/133603 |
| | | | 361/759 |
| 2012/0200496 A1* | 8/2012 | Colton | G06F 1/169 |
| | | | 345/157 |

FOREIGN PATENT DOCUMENTS

| | | |
|---|---|---|
| JP | 2014086358 A | 5/2014 |
| KR | 1020080056966 A | 6/2008 |
| KR | 1020100037852 A | 4/2010 |

OTHER PUBLICATIONS

Written Opinion for related International Application No. PCT/KR2021/000387; report dated Aug. 19, 2021; (4 pages).

\* cited by examiner

ELECTRONIC CONTROL APPARATUS

CROSS-REFERENCE TO RELATED APPLICATION

The present application is a National Stage of International Application No. PCT/KR2021/000387 filed on Jan. 12, 2021, which claims priority to and the benefit of Korean Utility Model Application No. 10-2020-0017536, filed on Feb. 13, 2020, the disclosure of which is incorporated herein by reference in its entirety.

FIELD

The present disclosure relates to an electronic control device, and more particularly, to an electronic control device for operating an electronic device such as an inverter for controlling a motor.

BACKGROUND

In general, an electronic control device called an operator panel is used to control operation of an inverter. Such an electronic control device is provided with various switches for operating the inverter, a display for monitoring, and the like.

A case of the electronic control device has a structure that is fused or fastened through a screw to prevent dust, moisture, and the like from being introduced thereinto. To this end, a manufacturing process of the electronic control device is complicated, and an increase in a lead time and an increase in cost are caused. Further, after assembling, disassembling is difficult, and thus post-management is difficult. In particular, when a fusion structure is applied, the disassembling is impossible, and thus, even when only some components fail, the entire electronic control device should be replaced.

Further, in the electronic control device according to the related art, in spite of the above-described fusion bonding or screw fastening structure, fine dust cannot be completely blocked. As a result, as the period of use increases, a clicking feeling and visibility are degraded due to the fine dust.

Meanwhile, electronic control devices according to the related art have certain restrictions on the shape of a cover to implement the fusion bonding or screw fastening structure. Accordingly, the degree of design freedom is insufficient, and a gripping feeling is not good.

SUMMARY

The present disclosure is directed to providing an electronic control device that can be easily assembled and disassembled.

The present disclosure is also directed to providing an electronic control device having high shielding properties to prevent introduction of fine dust.

The present disclosure is also directed to providing an electronic control device having a high degree of freedom in design and an improved grip feeling.

One aspect of the present disclosure provides an electronic control device including a lower cover that includes a side wall provided with a first coupling portion and a second coupling portion and has an open upper portion, a circuit board that is provided with, on an upper surface thereof, a button for operating an electronic device and is disposed inside the side wall of the lower cover, an intermediate cover that is provided with a third coupling portion fastened to the first coupling portion and a first button hole formed at a position corresponding to the button, wherein the third coupling portion is fastened to the first coupling portion, is coupled to the lower cover, and covers an upper surface of the circuit board, a button cover that covers the first button hole and a portion around the first button hole, is disposed on an upper surface of the intermediate cover, and is provided with a protrusion part at a position corresponding to the first hole, and an upper cover that includes a side wall provided with a fourth coupling portion fastened to the second coupling portion, has an open lower portion, and is provided with a second button hole through which the protrusion part is disposed, wherein the fourth coupling portion is fastened to the second coupling portion, is coupled to the lower cover, and covers the intermediate cover and the button cover.

The intermediate cover may be made of a hard plastic material, and the button cover may be made of a soft rubber material.

Any one or more of an outer border of the lower cover and an outer border of the upper cover may be at least partially rounded.

The circuit board may be provided with a display unit on an upper surface thereof, a portion of the intermediate cover, which covers at least the display unit, may be formed to be transparent, and the upper cover may include a window formed such that a portion of the intermediate cover, which covers the display unit, is exposed.

The circuit board may be provided with a light emitting diode (LED) element on an upper surface thereof, the intermediate cover may include a reflector provided at a position corresponding to the LED element, the button cover may be provided with a first reflector hole through which the reflector is disposed at a position corresponding to the reflector, and the upper cover may be provided with a second reflector hole formed to pass through a position corresponding to the first reflector hole.

The first coupling portion and the second coupling portion may be formed inside the side wall of the lower cover, and the fourth coupling portion may be formed inside the inner side wall of the upper cover.

The first coupling portion and the second coupling portion may be formed as bosses protruding inward from the side wall of the lower cover, the third coupling portion may be formed as a ring caught and fixed on the first coupling portion, and the fourth coupling portion may be formed as a ring caught and fixed on the second coupling portion.

The first to fourth coupling portions may be formed to be symmetrical to each other in a left-right direction.

The lower cover may include one or more fixing units that fix the circuit board to a lower surface thereof to prevent movement of the circuit board.

The intermediate cover may include a rib protruding to press the upper surface of the circuit board.

According to an embodiment of the present disclosure, an electronic control device can be easily assembled and disassembled through a hook fastening structure.

Further, according to an embodiment of the present disclosure, fine dust being introduced into the electronic control device can be effectively blocked by an intermediate cover and a button cover arranged between an upper cover and a lower cover.

Further, according to an embodiment of the present disclosure, outer borders of the upper cover and the lower cover can be rounded, and thus the degree of freedom in design and the grip feeling of the electronic control device can be improved.

DETAILED DESCRIPTION

Figure 1:
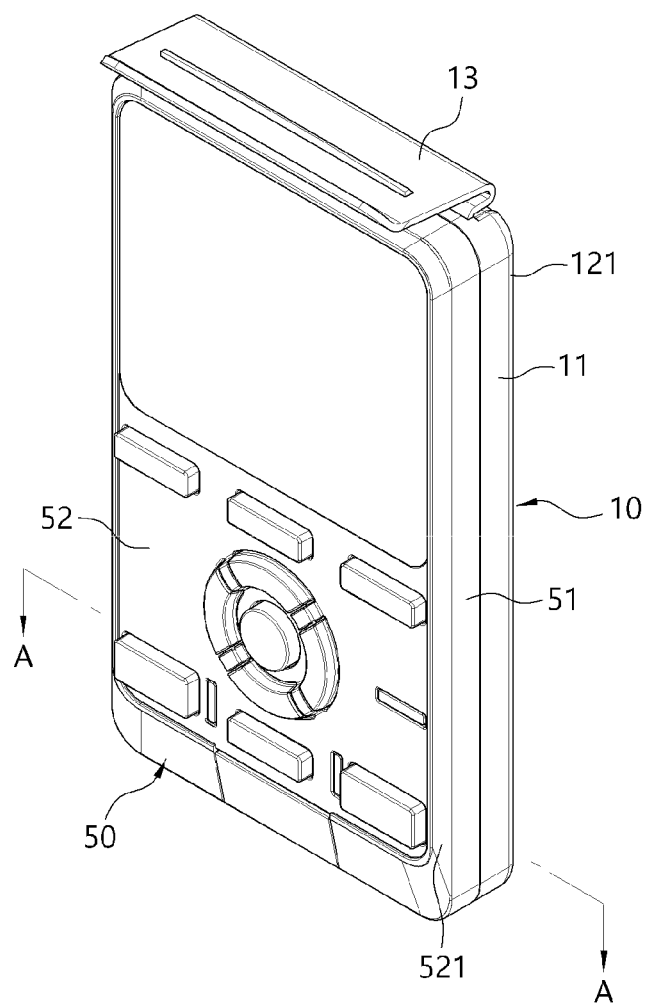
FIGS. 1 and 2 are perspective views illustrating an electronic control device according to an embodiment of the present disclosure from different angles.

Hereinafter, embodiments of the present disclosure will be described in detail with reference to the accompanying drawings so that those skilled in the art to which the present disclosure pertains may easily implement the present disclosure. The present disclosure may be implemented in various different forms and is not limited to the embodiments described herein. In the drawings, parts irrelevant to the description are omitted in order to clearly describe the present disclosure, and the same reference numerals are assigned to the same or similar components throughout the specification.

It should be understood in the present specification that the terms "include" or "have" are intended to describe that there are features, numbers, steps, operations, components, parts, or combinations thereof that are described in the specification and do not exclude in advance the possibility of the presence or addition of one or more other features, numbers, steps, operations, components, parts, or combinations thereof.

Further, in the present specification, spatially relative terms "front," "rear," "upper," or "lower" may be used to describe a correlation between components illustrated in the drawings. These are relative terms determined on the basis of the components illustrated in the drawings, and positional relationships may be interpreted in reverse according to an orientation.

Further, a case in which a component is present on a "front side," a "rear side," an "upper side," or a "lower side" of another component includes a case in which the component is disposed on the "front side," the "rear side," the "upper side," or the "lower side" in direct contact with another component as well as a case in which still another component is disposed therebetween, unless otherwise specified.

Figure 2:
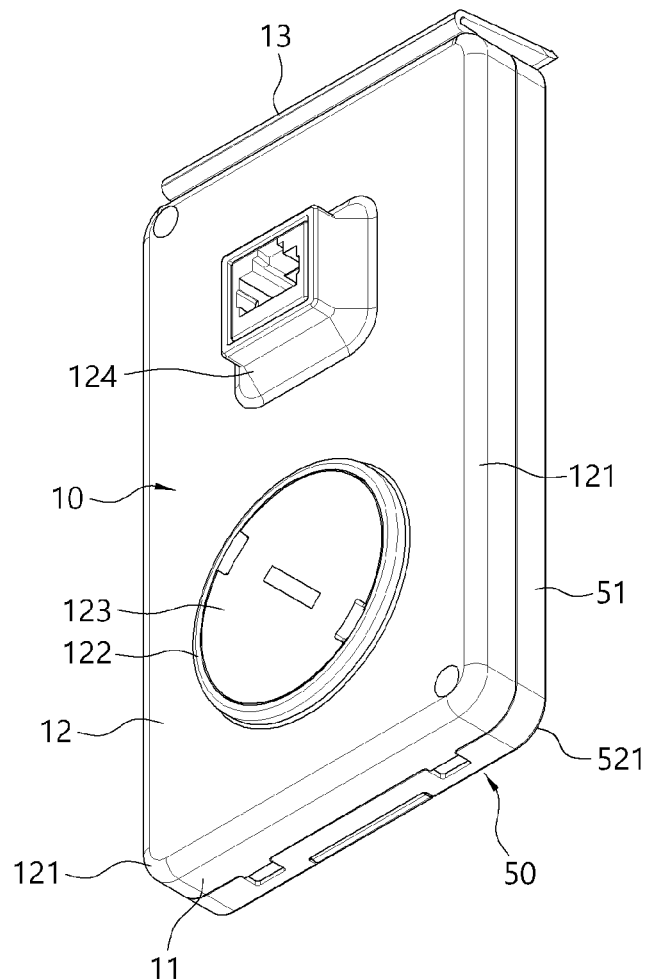
Figure 3:
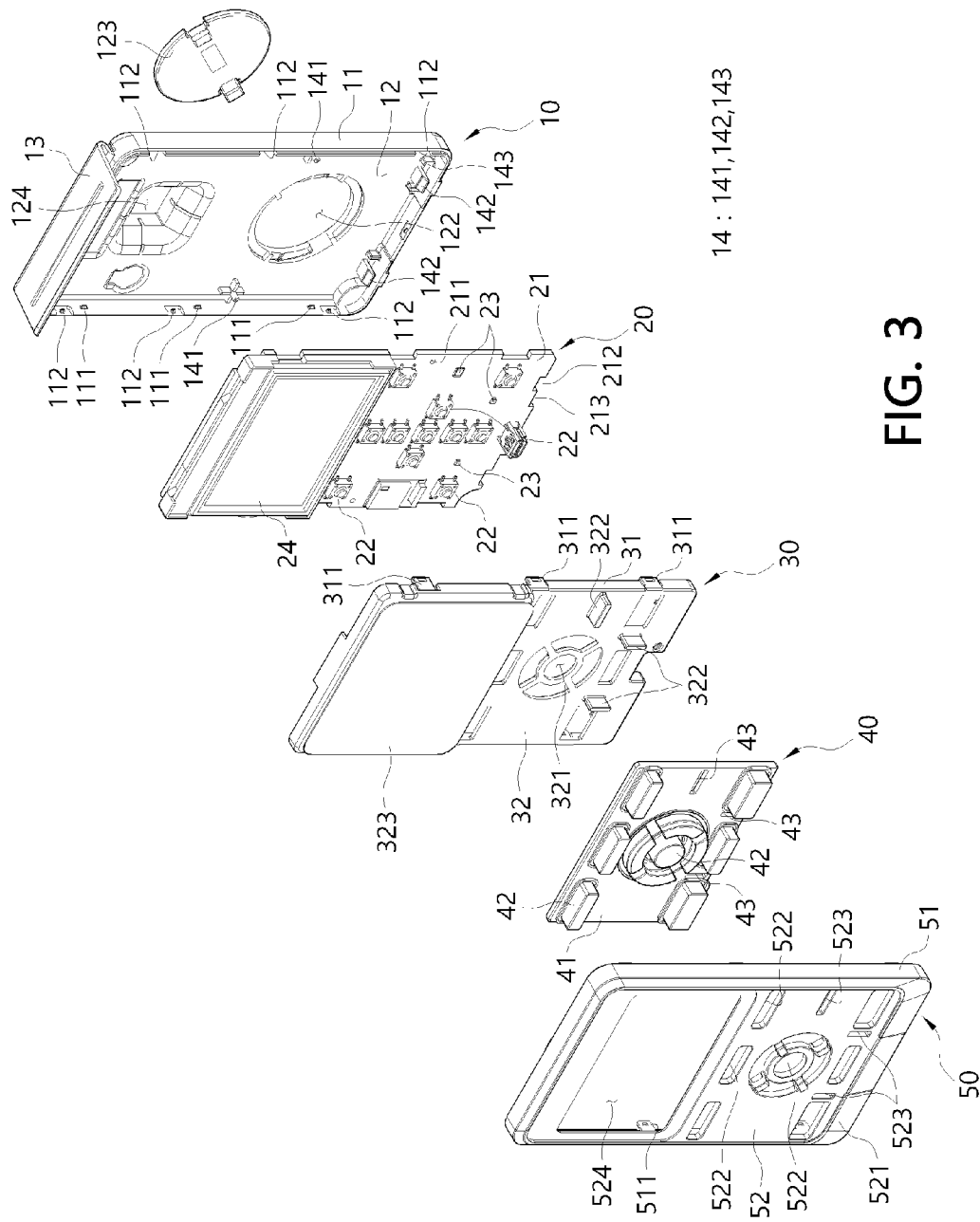
FIGS. 3 and 4 are exploded perspective views illustrating a state in which the electronic control device according to an embodiment of the present disclosure is disassembled from different angles.
Figure 4:
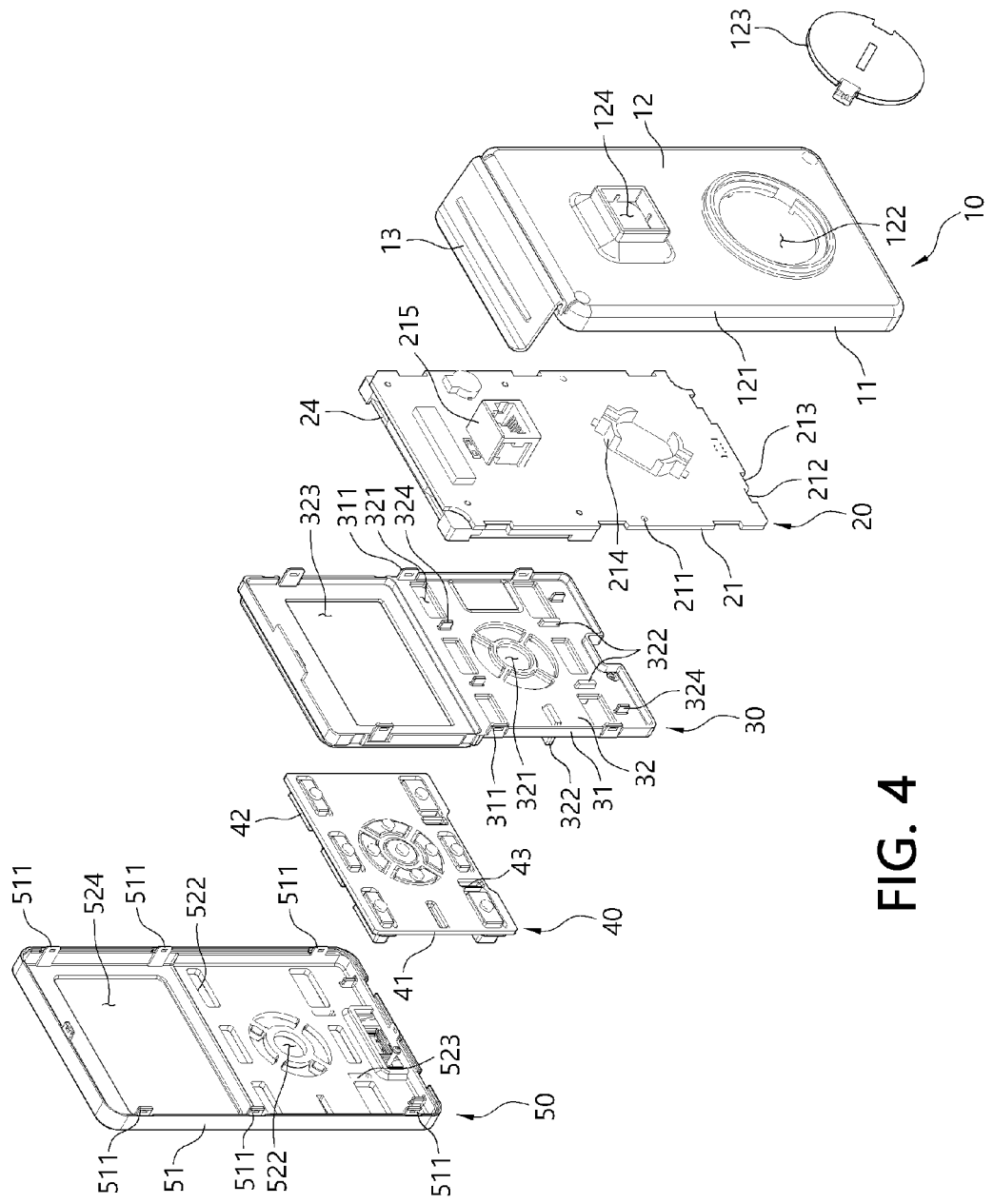
Figure 5:
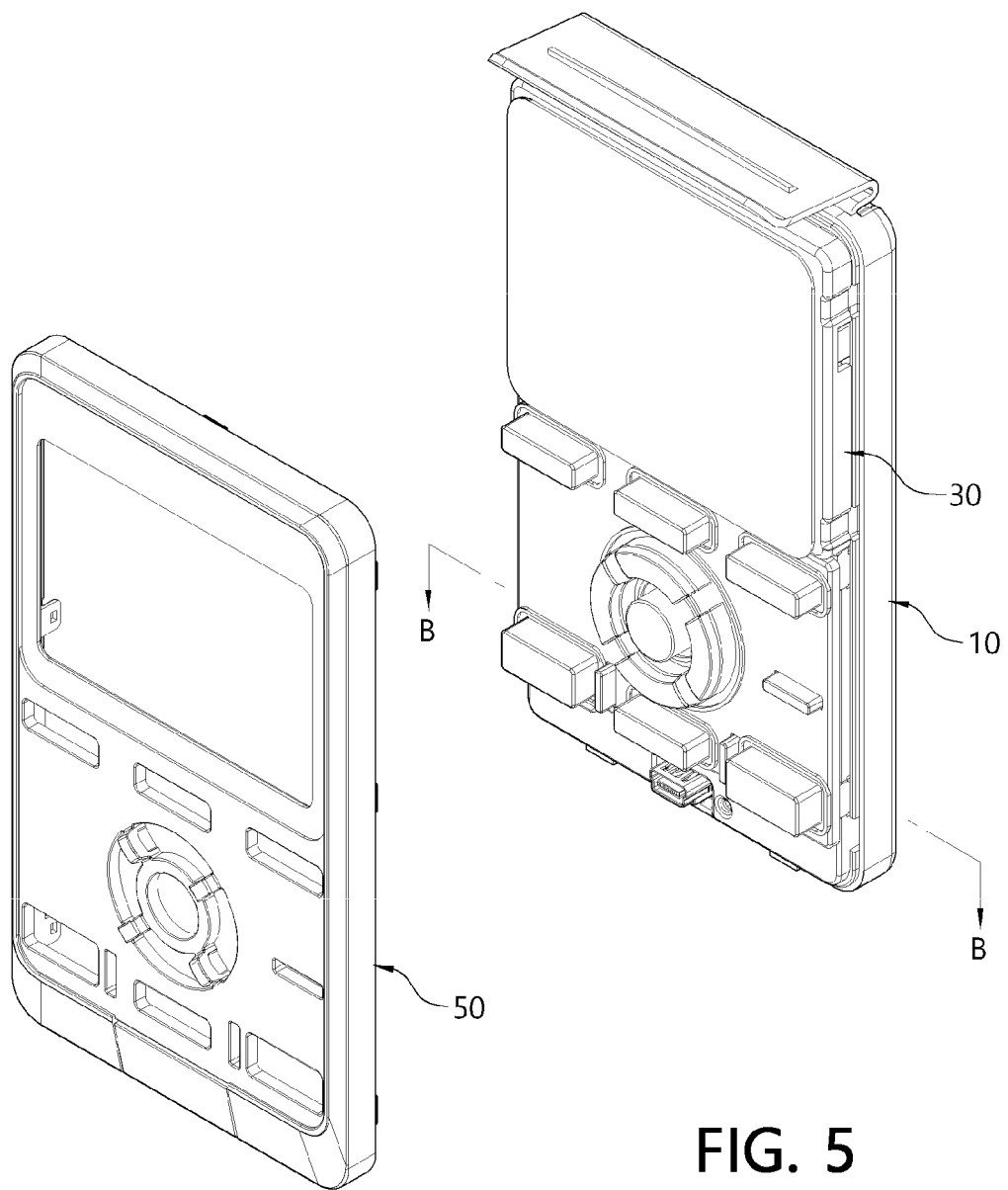
FIG. 5 is a view illustrating a state before an upper cover is coupled during an assembly process of the electronic control device according to an embodiment of the present disclosure.
Figure 6:
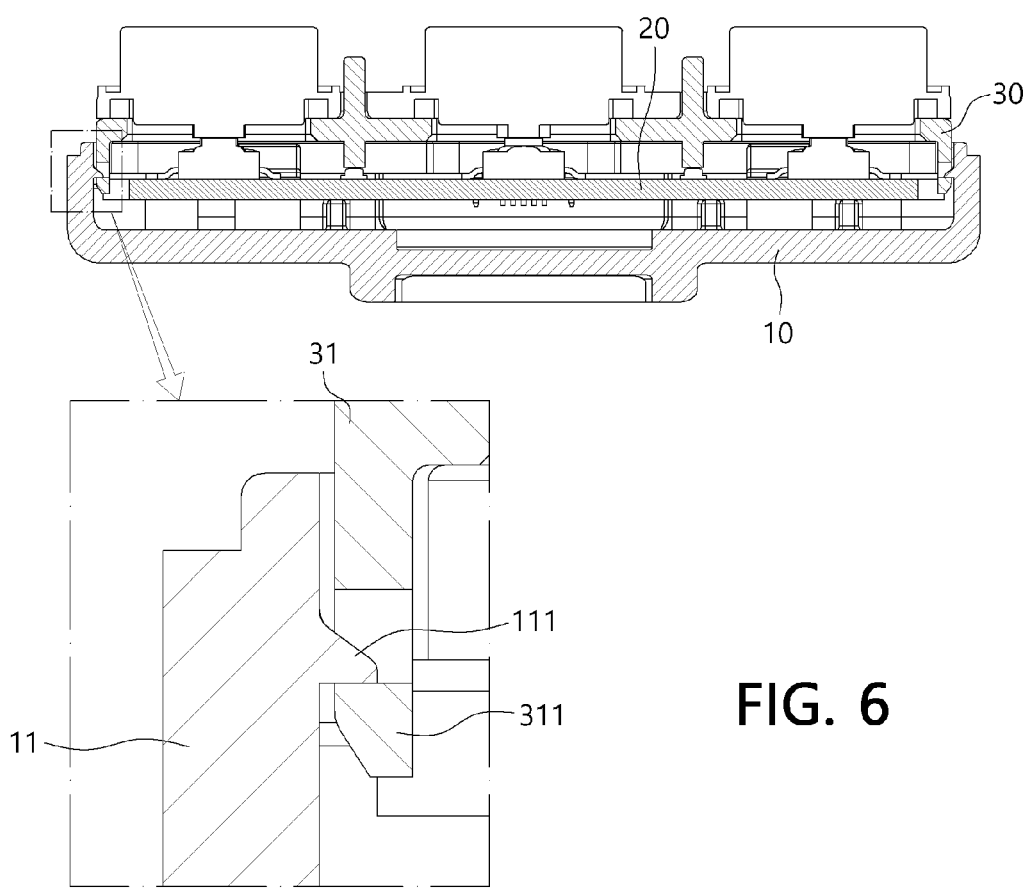
FIG. 6 is a cross-sectional view along line B-B' of FIG. 5.

FIGS. 1 and 2 are perspective views illustrating an electronic control device according to an embodiment of the present disclosure from different angles. FIGS. 3 and 4 are exploded perspective views illustrating a state in which the electronic control device according to an embodiment of the present disclosure is disassembled from different angles.

Referring to FIGS. 1 to 4, the electronic control device according to the embodiment of the present disclosure may be an operator panel used for controlling operation of an inverter. The electronic control device according to the embodiment of the present disclosure includes a lower cover 10, a circuit board 20, an intermediate cover 30, a button cover 40, and an upper cover 50.

The lower cover 10 includes a side wall 11 and a cover plate 12. The side wall 11 is provided with a first coupling portion 111 and a second coupling portion 112. The cover plate 12 forms a bottom of a space surrounded by the side wall 11. The circuit board 120 is disposed in the space surrounded by the side wall 11 of the lower cover 10. An upper portion of the lower cover 10 is open. In an embodiment of the present disclosure, the lower cover 10 has a rectangular shape.

Referring to FIG. 3, in an embodiment of the present disclosure, the first coupling portion 111 and the second coupling portion 112 are formed inside the side wall 11 of the lower cover 10. The first coupling portion 111 and the second coupling portion 112 are formed with bosses protruding from an inside of the side wall 11 of the lower cover 10. In more detail, the first coupling portion 111 and the second coupling portion 112 have a hook shape including a portion inclined from an upper side to a lower side, that is, a portion in which a protrusion height increases toward the lower side.

Further, in an embodiment of the present disclosure, three pairs of the first coupling portions 111 and the second coupling portions 112 are formed to be symmetrical to each other in a left-right direction. Meanwhile, the second coupling portion 112 is provided on a recess formed in an inner surface of the side wall 11 of the lower cover 10. Accordingly, the first coupling portion 111 may have a protrusion shape as compared to the second coupling portion 112.

The positions, the shapes, and the numbers of the first coupling portions 111 and the second coupling portions 112 are not limited to those of the embodiment of the present disclosure and may be changed as needed. Further, the lower cover 10 may include an additional coupling portion for coupling with the intermediate cover 30 or the upper cover 50 in addition to the first coupling portion 111 and the second coupling portion 112.

Referring to FIG. 4, both an edge portion and a corner portion of an outer border 121 of the cover plate 12 of the lower cover 10 are formed in a rounded shape. Further, a battery insertion hole 122 for inserting a battery coupled to the circuit board 20 is formed in the cover plate 12 of the lower cover 10, and a battery cover 123 is coupled to the battery insertion hole 122. In addition, a terminal connection hole 124 into which a connection terminal for connecting the circuit board 20 to an external device is to be inserted is formed in the cover plate 12 of the lower cover 10.

A bracket 13 is provided on one surface of the lower cover 10. The bracket 13 may be used when the electronic control device according to an embodiment of the present disclosure is fixed to an external device (not illustrated).

Meanwhile, as described above, the circuit board 20 is disposed in the space surrounded by the side wall 11 of the lower cover 10, and the lower cover 10 includes a fixing unit 14 for fixing the circuit board 20. The fixing unit 14 fixes the circuit board 20 to prevent movement of the circuit board 20.

Referring to FIG. 3, the fixing unit 14 includes a fixing pin 141 protruding from the cover plate 12 of the lower cover 10 to be fitted in the circuit board 20, a hook 142 provided on the cover plate 12 of the lower cover 10 to be caught and fixed while pressing an edge of the circuit board 20, and a rib 143 provided on the cover plate 12 of the lower cover 10 to press the edge of the circuit board 20 from a side surface.

The circuit board 20 is provided with a button 22 for operating an electronic device on an upper surface thereof and is disposed inside the side wall 11 of the lower cover 10. In this case, the electronic device may be an inverter for controlling a motor.

Referring to FIG. 3, in an embodiment of the present disclosure, the circuit board 20 includes a substrate part 21 on which a circuit is printed, the button 22 coupled to an upper surface of the substrate part 21, a light emitting diode (LED) element 23 coupled to the upper surface of the substrate part 21, and a display unit 24 coupled to the upper surface of the substrate part 21.

The substrate part 21 includes a fixing pin insertion hole 211 for inserting the fixing pin 141, and a hook fixing part 212 on which the hook 142 is caught and fixed and a rib contact part 213 pressed by the rib 143 are formed at an edge portion of the substrate part 21.

Meanwhile, referring to FIG. 4, a battery seating part 214 on which a battery is seated and a terminal connection part 215 to which an external terminal is connected are provided on a lower surface of the substrate part 21 of the circuit board 20. The battery seating part 214 communicates with the battery insertion hole 122 of the lower cover 10, and the terminal connection port 215 communicates with a terminal connection hole 124 of the lower cover 10.

The intermediate cover 30 is a member that is coupled to the lower cover 10 and covers the upper surface of the circuit board 20. The intermediate cover 30 is provided with a side wall 31 and a cover plate 32. The intermediate cover 30 is disposed between the lower cover 10 and the upper cover 50 to dually block fine dust, moisture, or the like from being introduced into the circuit board 20 together with the upper cover 50.

Referring to FIGS. 3 and 4, in an embodiment of the present disclosure, a third coupling portion 311 coupling the intermediate cover 30 to the lower cover 10 may be formed on the side wall 31. The positions and the number of the third coupling portions 311 correspond to the positions and the number of the first coupling portions 111. The third coupling portion 311 is formed as a ring caught and fixed on the first coupling portion 111. In detail, the third coupling portion 311 may be formed as a closed ring that is caught and fixed on the first coupling portion 111 having a hook shape.

The third coupling portion 311 may be formed to have elasticity. Referring to FIGS. and 6, when the intermediate cover 30 is pressed toward the lower cover 10, the third coupling portion 311 may be fixed in close contact with the inner surface of the side wall 11 of the lower cover 10 after riding over a portion in which a protrusion height increases from the first coupling portion 111 to a lower side due to elasticity.

The cover plate 32 of the intermediate cover 30 is formed to cover the upper surface of the circuit board 20. The cover plate 32 of the intermediate cover 30 includes a first button hole 321 formed at a position corresponding to the button 22, a reflector 322 provided at a position corresponding to the LED element 23, and a display cover part 323 covering the display unit 24.

In an embodiment of the present disclosure, the intermediate cover 30 may be made of a hard plastic material. Meanwhile, a portion of the intermediate cover 30, which covers at least the display unit 24, that is the display cover part 323, is formed to be transparent. Of course, the entire intermediate cover 30 may be formed to be transparent.

Referring to FIG. 4, the intermediate cover 30 may include a rib 324 protruding to press the upper surface of the circuit board 20. The rib 324 may be formed to protrude downward from a lower surface of the cover plate 32 of the intermediate cover 30. The rib 324 may suppress vertical movement of the circuit board 20 between the intermediate cover and the lower cover 10 by pressing the upper surface of the substrate part 21 of the circuit board 20. Thus, vibration of the circuit board 20 can be effectively prevented to prevent malfunction.

The button cover 40 covers the first button hole 321 and a portion around the first button hole 321 and is disposed on an upper surface of the intermediate cover 30. The button cover 40 together with the intermediate cover 30 prevents fine dust, moisture, and the like from penetrating into the circuit board 20. In detail, the button cover 40 effectively prevents the penetration of fine dust, moisture, and the like through the first button hole 321 of the intermediate cover 30.

It is preferable that the button cover 40 be in close contact with the intermediate cover 30. To this end, the button cover 40 may be made of a soft rubber material.

Referring to FIG. 3, the button cover 40 includes a cover body 41 covering the first button hole 321 and the portion around the first button hole 321, a protrusion part 42 provided to protrude from a position corresponding to the first button hole 321, and a first reflector hole 43 formed such that the reflector 322 is disposed therethrough at a position corresponding to the reflector 322.

The cover body 41 covers the portion around the first button hole 321. The cover body 41 is disposed in close contact with the portion around the first button hole 321.

The protrusion part 42 is a part enabling a user to click the button 22 of the circuit board 20 when the electronic control device according to the embodiment of the present disclosure is used. In other words, when the user pushes the protrusion part 42, the protrusion part 42 is deformed to press the button 22 of the substrate part 21 through the first button hole 321 and click the button 22.

The first reflector hole 43 is formed such that the reflector 322 passes therethrough. It is preferable that the first reflector hole 43 be formed in a size in which the first reflector hole 43 is in close contact with a side surface of the reflector 322 to prevent foreign substances from being introduced into a gap between the reflector 322 and the first reflector hole 43.

The upper cover 50 includes a side wall 51 and a cover plate 52. The side wall 51 is provided with a fourth coupling portion 511 fastened to the second coupling portion 112. The cover plate 52 forms a ceiling of a space surrounded by the side wall 51. A lower portion of the upper cover 50 is open. In an embodiment of the present disclosure, the upper cover 50 is formed in a shape corresponding to the lower cover 10.

Referring to FIGS. 3 and 4, the fourth coupling portion 511 coupling the upper cover 50 to the lower cover 10 is formed inside the side wall 51. The positions and the number of the fourth coupling portions 511 correspond to the positions and the number of the second coupling portions 112. The fourth coupling portion 511 is formed as a ring caught and fixed on the second coupling portion 112. In detail, the fourth coupling portion 511 may be formed as a closed ring that is caught and fixed on the second coupling portion 112 having a hook shape.

Figure 7:
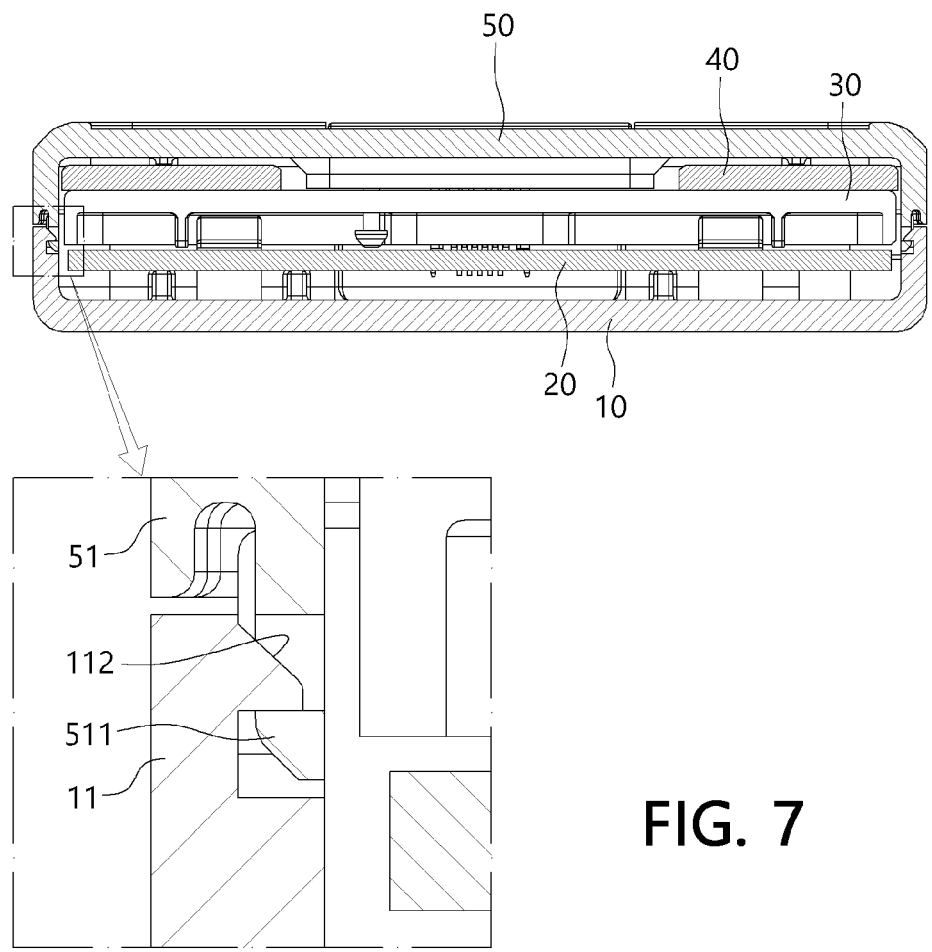
FIG. 7 is a cross-sectional view along line A-A' of FIG. 1.

The fourth coupling portion 511 may be formed to have elasticity. Referring to FIG. 7, when the upper cover 50 is pressed toward the lower cover 10, the fourth coupling portion 511 may be fixed in close contact with the side wall 11 of the lower cover 10 after riding over a portion in which a protrusion height increases from the first coupling portion 111 to a lower side due to elasticity.

Both an edge portion and a corner portion of an outer border 521 of the cover plate 52 of the upper cover 50 are formed in a rounded shape. Further, a second button hole 522 through which the protrusion part 42 of the button cover 40 is disposed and a second reflector hole 523 formed to pass through a position corresponding to the first reflector hole 43 are formed in the cover plate 52 of the upper cover 50.

Further, a window 524 is formed in the cover plate 52 of the upper cover 50 so that a portion of the intermediate cover 30, which covers the display unit 24, is exposed.

In the case of the electronic control device according to the embodiment of the present disclosure, the circuit board 20 is disposed between the lower cover 10 and the upper cover 50, the intermediate cover 30 and the button cover 40 are arranged between the circuit board and the upper cover 50, and thus fine dust, moisture, and the like being introduced into the circuit board 20 is effectively prevented.

Further, according to the electronic control device according to the embodiment of the present disclosure, through coupling between the first coupling portion 111 and the third coupling portion 311 and coupling between the second coupling portion 112 and the fourth coupling portion 511, assembly can be easily performed without using fusion or screws, and disassembly can also be performed.

Further, according to the electronic control device according to the embodiment of the present disclosure, the first coupling portion 111, the second coupling portion 112, the third coupling portion 311, and the fourth coupling portion 511 may not be exposed to the outside of the electronic control device, and a point at which the side wall 11 of the lower cover 10 and the side wall 11 of the upper cover 50 meet each other may be formed at a middle portion of a side surface of the electronic control device. Accordingly, the degree of freedom in design can be increased, and the outer appearance of the electronic control device can be simplified.

Although embodiments of the present disclosure have been described, the spirit of the present disclosure is not limited to the embodiments presented in the present specification. Those skilled in the art who understand the spirit of the present disclosure can easily propose other embodiments by adding, changing, deleting, supplementing, or the like components within the same scope of the spirit. Further, these other embodiments also belong to the scope of the spirit of the present disclosure.

The electronic control device according to the present disclosure can be used to operate an inverter used in an industrial electronic device.

The invention claimed is:

1. An electronic control device comprising:
  a lower cover that includes a side wall in which a first coupling portion and a second coupling portion are integrally formed and has an open upper portion;
  a circuit board that is provided with, on an upper surface thereof, a button for operating an electronic device and is disposed inside the side wall of the lower cover;
  an intermediate cover that is provided with a third coupling portion fastened to the first coupling portion and integrally formed with a part of the intermediate cover and a first button hole formed at a position corresponding to the button, wherein the third coupling portion is fastened to the first coupling portion, is coupled to the lower cover, and covers the upper surface of the circuit board;
  a button cover that covers the first button hole and a portion around the first button hole, is disposed on an upper surface of the intermediate cover, and is provided with a protrusion part at a position corresponding to the first button hole; and
  an upper cover that includes a side wall provided with a fourth coupling portion fastened to the second coupling portion and integrally formed with a part of the upper cover, has an open lower portion, and is provided with a second button hole through which the protrusion part is disposed, wherein the fourth coupling portion is fastened to the second coupling portion, is coupled to the lower cover, and covers the intermediate cover and the button cover.

2. The electronic control device of claim 1, wherein the intermediate cover is made of a hard plastic material, and the button cover is made of a soft rubber material.

3. The electronic control device of claim 1, wherein any one or more of an outer border of the lower cover and an outer border of the upper cover are at least partially rounded.

4. The electronic control device of claim 1, wherein:
  the circuit board is provided with a display unit on an upper surface thereof;
  a portion of the intermediate cover, which covers at least the display unit, is formed to be transparent; and
  the upper cover includes a window formed such that a portion of the intermediate cover, which covers the display unit, is exposed.

5. The electronic control device of claim 1, wherein:
  the circuit board is provided with a light emitting diode (LED) element on an upper surface thereof;
  the intermediate cover includes a reflector provided at a position corresponding to the LED element;
  the button cover is provided with a first reflector hole through which the reflector is disposed at a position corresponding to the reflector; and
  the upper cover is provided with a second reflector hole formed to pass through a position corresponding to the first reflector hole.

6. The electronic control device of claim 1, wherein:
  the first coupling portion and the second coupling portion are formed inside the side wall of the lower cover; and
  the fourth coupling portion is formed inside the inner side wall of the upper cover.

7. The electronic control device of claim 6, wherein:
  the first coupling portion and the second coupling portion are formed as bosses protruding inward from the side wall of the lower cover;
  the third coupling portion is formed as a ring caught and fixed on the first coupling portion; and
  the fourth coupling portion is formed as a ring caught and fixed on the second coupling portion.

8. The electronic control device of claim 1, wherein the first to fourth coupling portions are formed to be symmetrical to each other in a left-right direction.

9. The electronic control device of claim 1, wherein the lower cover includes one or more fixing units that fix the circuit board to a lower surface thereof to prevent movement of the circuit board.

10. The electronic control device of claim 1, wherein the intermediate cover includes a rib protruding to press the upper surface of the circuit board.

11. An electronic control device comprising:
  a lower cover that includes a first side wall in which a first coupling portion and a second coupling portion are integrally formed and has an open upper portion;
  a circuit board that is provided with, directly on a first upper surface thereof, a button for operating an electronic device, wherein the circuit board is disposed inside the first side wall of the lower cover;
  an intermediate cover that includes a second side wall in which a third coupling portion is integrally formed and that defines a first button hole at a position corresponding to the button, wherein the third coupling portion is directly fastened to the first coupling portion such that, when coupled to the lower cover, the intermediate cover secures the circuit board between a lower surface of the intermediate cover and the lower cover;

a button cover directly disposed on an upper surface of the intermediate cover, opposite to the lower surface, having a protrusion part at a position that covers at least the first button hole; and an upper cover that includes a third side wall in which a fourth coupling portion is integrally formed and defines a second button hole through which the protrusion part is disposed, wherein the fourth coupling portion is directly fastened to the second coupling portion such that, when coupled to the lower cover, secures the button cover between a lower surface of the upper cover that faces the upper surface of the intermediate cover and the upper surface of the intermediate cover.

* * * * *